United States Patent
Ishida et al.

(10) Patent No.: US 10,840,427 B2
(45) Date of Patent: Nov. 17, 2020

(54) THERMOELECTRIC CONVERSION ELEMENT, THERMOELECTRIC CONVERSION SYSTEM AND MANUFACTURING METHOD OF THERMOELECTRIC CONVERSION ELEMENT

(71) Applicant: NEC Corporation, Tokyo (JP)

(72) Inventors: Masahiko Ishida, Tokyo (JP); Akihiro Kirihara, Tokyo (JP); Shigeru Koumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 285 days.

(21) Appl. No.: 14/390,850

(22) PCT Filed: Apr. 3, 2013

(86) PCT No.: PCT/JP2013/060185
§ 371 (c)(1),
(2) Date: Oct. 6, 2014

(87) PCT Pub. No.: WO2013/151088
PCT Pub. Date: Oct. 10, 2013

(65) Prior Publication Data
US 2015/0101648 A1 Apr. 16, 2015

(30) Foreign Application Priority Data
Apr. 4, 2012 (JP) .................. 2012-085925

(51) Int. Cl.
*H01L 37/00* (2006.01)

(52) U.S. Cl.
CPC .................. *H01L 37/00* (2013.01)

(58) Field of Classification Search
CPC .................. H01L 37/00; H01L 35/00
USPC .................. 136/200–242
See application file for complete search history.

(56) References Cited

U.S. PATENT DOCUMENTS

| 4,988,669 | A | * | 1/1991 | Dersch | ........... H01L 39/143 174/125.1 |
| 5,563,368 | A | * | 10/1996 | Yamaguchi | ........ H01L 37/00 136/200 |
| 6,376,926 | B1 | * | 4/2002 | Ruiz | ............ H02M 3/07 136/205 |

(Continued)

FOREIGN PATENT DOCUMENTS

| JP | 10-051039 | 2/1998 |
| JP | 2009-130070 | 6/2009 |

(Continued)

OTHER PUBLICATIONS

English translation of Uchida et al., JP2009/130070.*

(Continued)

*Primary Examiner* — Niki Bakhtiari
(74) *Attorney, Agent, or Firm* — Nixon & Vanderhye

(57) ABSTRACT

A thermoelectric conversion element includes a cable. The cable includes a first member extended in the axis direction of the cable, and a second member extended in the axis direction to cover at least a part of the outer face of the first member. One of the first and second members is a magnetic body. The other of the first and second members is a conductive body formed of material exhibiting a spin orbit coupling.

25 Claims, 12 Drawing Sheets

(56) References Cited

U.S. PATENT DOCUMENTS

| | | | | |
|---|---|---|---|---|
| 2006/0211579 A1* | 9/2006 | Yamaguchi | ............ | H01B 12/14 |
| | | | | 505/230 |
| 2008/0303375 A1* | 12/2008 | Carver | ................... | H01L 37/00 |
| | | | | 310/306 |
| 2010/0276770 A1 | 11/2010 | Uchida et al. | | |
| 2011/0084349 A1* | 4/2011 | Uchida | .............. | C01G 49/0054 |
| | | | | 257/421 |
| 2014/0102501 A1* | 4/2014 | Kirihara | ................. | H01L 37/00 |
| | | | | 136/205 |

FOREIGN PATENT DOCUMENTS

| | | |
|---|---|---|
| JP | 2010-056160 | 3/2010 |
| JP | 2013-072703 | 4/2013 |
| WO | WO2012-169377 | * 12/2012 |

OTHER PUBLICATIONS

English translation of Nakamura, et al., JP2010/56160.*
English translation of Amano et al., JP10-51039.*
International Search Report, PCT/JP2013/060185, dated Jun. 25, 2013.
Uchida et al., "Spin Seebeck Insulator"., Nature Materials, published online Sep. 2010. vol. 9, p. 894.
Uchida et al., "Observation of Longitudinal Spin-Seebeck Effect in Magnetic Insulators", Applied physics Letters, 2010, vol. 97. p. 172505.

* cited by examiner

THERMOELECTRIC CONVERSION ELEMENT, THERMOELECTRIC CONVERSION SYSTEM AND MANUFACTURING METHOD OF THERMOELECTRIC CONVERSION ELEMENT

TECHNICAL FIELD

The present invention relates to a thermoelectric conversion element based on the spin Seebeck effect and the inverse spin Hall effect, a manufacturing method of the same and a thermoelectric conversion system using the thermoelectric conversion element.

BACKGROUND ART

In recent years, an electronic technology called "spintronics" has been highlighted. While the conventional electronics only uses the "charge", which is one property of the electron, the spintronics additionally makes use of the "spin", which is another property of the electron. Especially, the "spin current", which is a flow of spin angular momentum of electrons, is an important concept. Since the energy loss of a spin current is small, the use of a spin current may enable a highly-efficient information communication. Accordingly, a generation, detection and control of a spin current are important subjects.

For instance, there is known a phenomenon in which a spin current is generated by an electric current. This phenomenon is called "spin Hall effect". There is also known a phenomenon in which an electromotive force is generated by a spin current, vice versa. This phenomenon is called "inverse spin Hall effect". A spin current can be detected by using the inverse spin Hall effect. It should be noted that both of the spin Hall effect and inverse spin Hall effect remarkably appear in material with a strong "spin orbit coupling" (such as Pt and Au).

Furthermore, recent researches have proved the existence of the spin Seebeck effect in magnetic material. The spin Seebeck effect is a phenomenon in which an application of a temperature gradient across a magnetic body generates a spin current in the direction parallel to the temperature gradient (see patent literature 1, non-patent literatures 1 and 2). In other words, heat is converted into a spin current through the spin Seebeck effect (heat to spin-current conversion). In patent literature 1, a spin Seebeck effect in a NiFe film, which is ferromagnetic metal, is reported. In non-patent literatures 1 and 2, a spin Seebeck effect at the interface between magnetic dielectric material such as yttrium iron garnet (YIG: $Y_3Fe_5O_{12}$) and a metallic film is reported.

It should be noted that a spin current generated by a temperature gradient can be converted into an electric field (current or voltage) by using the above-described inverse spin Hall effect. This implies that a "thermoelectric conversion", in which a temperature gradient is converted into electricity, can be achieved by using both of the spin Seebeck effect and the inverse spin Hall effect.

FIG. 1 illustrates the structure of a thermoelectric conversion element disclosed in patent literature 1. A thermal spin-current conversion section 102 is formed on a sapphire substrate 101. The thermal spin-current conversion section 102 has a layered structure of a Ta film 103, a PdPtMn film 104 and a NiFe film 105. The NiFe film 105 has an in-plane magnetization. Formed on the NiFe film 105 is a Pt electrode 106, which has both ends connected to terminals 107-1 and 107-2, respectively.

In the thermoelectric conversion element thus structured, the NiFe film 105 has the function of generating a spin current from a temperature gradient through the spin Seebeck effect, while the Pt electrode 106 has the function of generating an electromotive force from the spin current through the inverse spin Hall effect. More specifically, when a temperature gradient is applied across the NiFe film 105 in the in-plane direction, a spin current is generated in the direction parallel to the temperature gradient. This results in that the spin current flows into the Pt electrode 106 from the NiFe film 105; alternatively, the spin current may flow into the NiFe film 105 from the Pt electrode 106. Across the Pt electrode 106, an electromotive force is generated in the direction perpendicular to both of the spin current direction and the magnetization direction of the NiFe film, due to the inverse spin Hall effect. The electromotive force can be extracted from the terminals 107-1 and 107-2 disposed at the both ends of the Pt electrode 106.

CITATION LIST

Patent Literature

Patent Literature 1: JP 2009-130070 A

Non-Patent Literature

Non-patent literature 1: Uchida et al., "Spin Seebeck insulator", Nature Materials, 2010, vol. 9, p. 894.

Non-patent literature 2: Uchida et al., "Observation of longitudinal spin-Seebeck effect in magnetic insulators", Applied Physics Letters, 2010, vol. 97, p 172505.

DISCLOSURE OF INVENTION

Thermoelectric conversion elements may be installed in various circumstances (for example, the shape of the heat source); however, the thermoelectric conversion element illustrated in FIG. 1, which has a fixed shape, suffers from restrictions in actual installations. When the heat source has a cylindrical shape, for example, it is difficult to arrange the planer type thermoelectric conversion element illustrated in FIG. 1 on the outer face of the cylindrical heat source.

An objective of the present invention is to provide a thermoelectric conversion element which allows various installations in accordance with the circumstances.

In one aspect of the present invention, a thermoelectric conversion element includes a cable. The cable includes a first member extended in the axis direction of the cable, and a second member extended in the axis direction to cover at least a part of the outer face of the first member. One of the first and second members is a magnetic body. The other of the first and second members is a conductive body formed of material exhibiting a spin orbit coupling.

The thermoelectric conversion element according to the present invention can be installed in various forms in accordance with the circumstances.

DESCRIPTION OF EXEMPLARY EMBODIMENTS

Exemplary embodiments of the present invention are described below with reference to the attached drawings.

1. First Exemplary Embodiment

Figure 1:
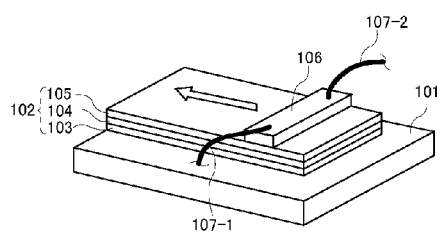
FIG. 1 is an oblique perspective view schematically illustrating the thermoelectric conversion element disclosed in patent literature 1.
Figure 2:
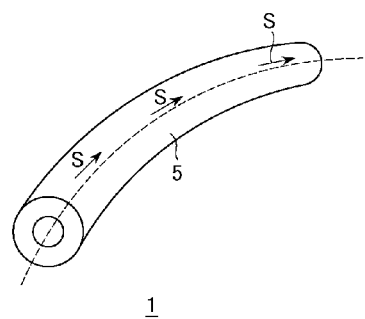
FIG. 2 schematically illustrates a thermoelectric conversion element according to a first exemplary embodiment of the present invention.

FIG. 2 schematically illustrates a thermoelectric conversion element 1 according to a first exemplary embodiment of the present invention. The thermoelectric conversion element 1 according to this exemplary embodiment includes a cable 5. As illustrated in FIG. 2, the cable 5 is shaped in an elongated shape, and the extending direction of the cable 5 is referred to as "axis direction S", hereinafter.

The cable 5 has flexibility. The "flexibility" mentioned herein means to include both of the concepts of "plasticity" and "elasticity". That is, the cable 5 is plastically or elastically deformable. In other words, the cable 5 can be bent. It should be noted that, since the cable 5 can be bent, the axis direction S may be locally defined at respective locations along the cable 5 (see FIG. 2).

Figure 3A:
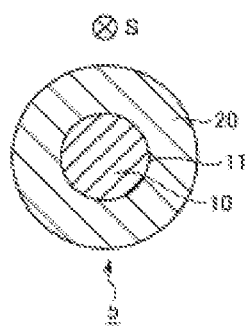
FIGS. 3A and 3B schematically illustrate the cross section structure of a cable of the thermoelectric conversion element according to the first embodiment of the present invention.

FIG. 3A schematically illustrates the cross section structure of the cable 5. Illustrated in this figure is the cross section structure on the plane perpendicular to the axis direction S. It should be noted that the term "cross section" recited in the following description also means the cross section perpendicular to the axis direction S, unless otherwise noted.

As illustrated in FIG. 3A, the cable 5 includes a first member 10 and a second member 20. The first member 10 is extended in the axis direction S. The second member 20 is also extended in the axis direction S. Furthermore, the second member 20 covers the outer face 11 of the first member 10. That is, the first member 10 is an inner layer and the second member 20 is an outer layer. In other words, the first member 10 is located in the inward radial direction with respect to the second member 20 and the second member 20 is located in the outward radial direction with respect to the first member 10. The "radial direction" mentioned here means the direction perpendicular to the axis direction S and directed outward from the center axis of the cable 5.

In this exemplary embodiment, one of the first member 10 and the second member 20 is a "magnetic body" which generates (or drives) a spin current from the temperature gradient through the spin Seebeck effect and the other of the first member 10 and the second member 20 is a "conductive body" which generates an electromotive force from the spin current through the inverse spin Hall effect.

The magnetic body is formed of material which exhibits the spin Seebeck effect. The material of the magnetic body may be ferromagnetic metal or magnetic insulator. Examples of the ferromagnetic metal include NiFe, CoFe and CoFeB. Examples of the magnetic insulator include yttrium iron garnet (YIG, $Y_3Fe_5O_{12}$), bismuth-doped YIG (Bi:YIG), lanthanum-doped YIG ($LaY_2Fe_5O_{12}$) and yttrium gallium iron garnet ($Y_3Fe_{5-x}Ga_xO_{12}$). In view of the suppression of heat conduction by electrons, it is preferable to use magnetic insulator. In any case, this magnetic body is formed with such a thickness that the magnetic body has flexibility.

The conductive body is formed of material which exhibits the inverse spin Hall effect (spin orbit coupling). In detail, the material of the conductive body includes metal material exhibiting a strong spin orbit coupling. For example, Au, Pt, Pd, Ir and other f-orbital metals, which exhibit a relatively strong spin orbit coupling, or metal alloys containing the same may be used. A similar effect can be obtained by doping Au, Pt, Pd, Ir or the like to a level of 0.5 to 10% into general metal film materials such as Cu. Alternatively, the conductive body may be formed of oxide such as ITO. In view of the efficiency, it is preferable that the thickness of the conductive body is adjusted to about the "spin diffusion length (spin relaxation length)", which depends on the material of the conductive body. When a Pt film is used as the conductive body, for example, it is preferable that the thickness of the Pt film is adjusted to about 10 to 30 nm. In any case, this conductive body is formed with such a thickness that the conductive body has flexibility.

Due to the above-described structure, the cable 5 has the function as a "thermoelectric conversion section" which makes use of the spin Seebeck effect and the inverse spin Hall effect. The electric power generated by this thermoelectric conversion section can be represented as the function of parameters including the length along the axis direction S, the spin Seebeck coefficient, the effective temperature difference applied across the thermoelectric conversion section and the resistance of the conductive body, where the generated electric power increases proportionally to the square of the length, the spin Seebeck coefficient and the effective temperature difference, while the generated electric power increases inversely proportionally to the resistance. For a given temperature difference, the electromotive force can be increased by connecting the thermoelectric conversion sections in series, and the current level can be increased by connecting the thermoelectric conversion sections in parallel.

Figure 4:
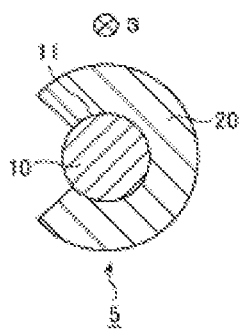
FIG. 4 schematically illustrates the cross section structure of a cable of the thermoelectric conversion element according to the first exemplary embodiment of the present invention.

It should be noted that it is not necessary that the second member 20 covers the whole of the outer face 11 of the first member 10. Since what is required is an exchange of a spin current between the first member 10 and the second member 20, the second member 20 may cover only a part of the outer face 11 of the first member 10 as illustrated in FIG. 4. In other words, what is required is that the second member 20 covers at least a part of the outer face 11 of the first member 10.

Figure 3B:
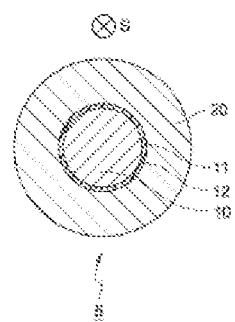

It is not necessary that the first member 10 and the second member 20 are in direct contact. As illustrated in FIG. 3B, another thin film 12 may be inserted between the first member 10 and the second member 20 as long as a spin current is exchanged between the first member 10 and the second member 20. The above-described phrase "the second member 20 covers the outer face 11 of the first member 10" means to include the state in which the second member 20 covers the outer face 11 with another film inserted therebetween.

Figure 5:
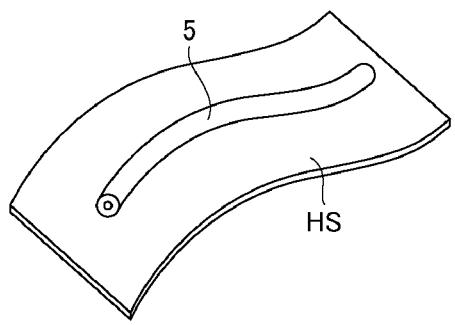
FIG. 5 schematically illustrates one example of a thermoelectric conversion system according to the first exemplary embodiment of the present invention.
Figure 6:
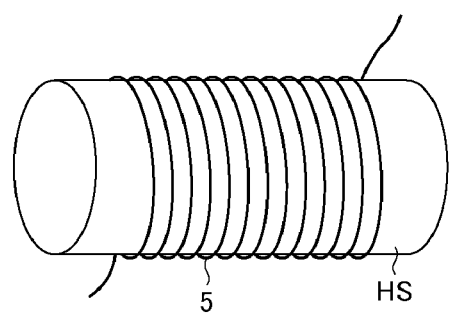
FIG. 6 schematically illustrates another example of the thermoelectric conversion system according to the first exemplary embodiment of the present invention.

In this exemplary embodiment, various installations are allowed in accordance with the circumstances (for example, the shape of the heat source), since the cable 5 can be bent. When the heat source HS has a curved surface as illustrated in FIG. 5, for example, the cable 5 may be bent along the curved surface. Also, when the heat source HS is cylindrical as illustrated in FIG. 6, for example, the cable 5 may be wound around the cylindrical heat source HS. This also allows easily controlling the output voltage or output current by adjusting the number of the turns. As thus described, the thermoelectric conversion element 1 according to this exemplary embodiment allows installations in accordance with the circumstances and purposes, thereby providing an extremely high practical performance.

It should be noted that the thermoelectric conversion element 1 and the heat source HS illustrated in FIGS. 5 and 6 may be collectively referred as "thermoelectric conversion system". The heat source HS is arranged to be thermally coupled with the cable 5 of the thermoelectric conversion element 1. It should be noted that the thermal coupling is not limited to a direct contact. Any arrangement of the heat source HS and the cable 5 is allowed as long as heat is exchanged between the heat source HS and the cable 5. Due to the thermal coupling thus described, an electromotive force is generated across the cable 5 (thermoelectric conversion section) through the spin Seebeck effect and the inverse spin Hall effect.

2. Second Exemplary Embodiment

The magnetic body generates (or drives) a spin current Js from the temperature gradient $\nabla T$ through the spin Seebeck effect. The direction of the spin current Js is parallel to or antiparallel to the direction of the temperature gradient $\nabla T$. In the meanwhile, the conductive body generates an electromotive force from the above-described spin current Js through the inverse spin Hall effect. The direction of the generated electromotive force is given as the outer product of the direction of the magnetization M of the magnetic body and the direction of the temperature gradient $\nabla T$(E, V//M× $\nabla T$).

The direction of the electromotive force may be arbitrarily selected in accordance with the purpose; one preferred purpose may be generation of an electromotive force along the axis direction S of the cable 5. As discussed above, the direction of the electromotive force is at least perpendicular to the direction of the magnetization M of the magnetic body. Accordingly, the generation of the electromotive force along the axis direction S requires that the magnetization M of the magnetic body includes a component perpendicular to the axis direction S. Such cases are described in the second exemplary embodiment.

Figure 7:
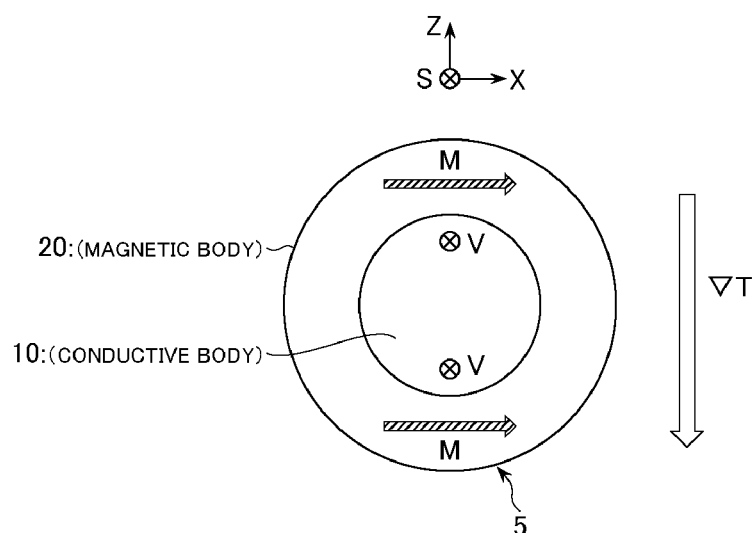
FIG. 7 schematically illustrates the cross section structure of a cable of a thermoelectric conversion element according to a second exemplary embodiment of the present invention.

FIG. 7 schematically illustrates the cross section structure of the cable 5 of the thermoelectric conversion element 1 according to the second exemplary embodiment. Presented herein as one example is the case where the first member 10, which is an inner layer, is a conductive body and the second member 20, which is an outer layer, is a magnetic body. In FIG. 7, the X and Z directions are each defined as being perpendicular to the axis direction S, and the X and Z directions are defined as being also perpendicular to each other. As illustrated in FIG. 7, the magnetization M of the magnetic body 20 includes at least a component of the X direction, which is perpendicular to the axis direction S. In this case, an electromotive force is generated along the axis direction S when a temperature gradient $\nabla T$ is applied to the cable 5 along the Z direction.

Figure 8:
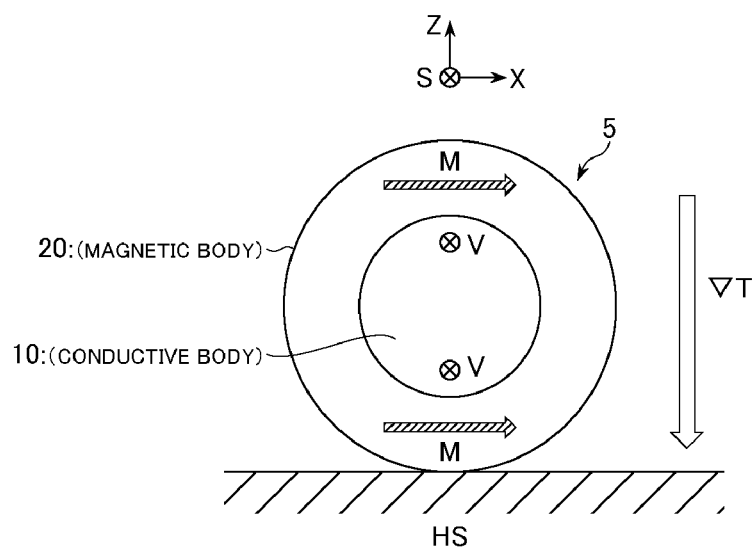
FIG. 8 schematically illustrates one example of a thermoelectric conversion system according to the second exemplary embodiment of the present invention.

FIG. 8 illustrates the state in which the cable 5 illustrated in FIG. 7 is arranged to be thermally coupled with the heat source HS. In FIG. 8, the direction from the heat source HS to the cable 5 is directed in the Z direction and parallel to the direction of the temperature gradient $\nabla T$. Furthermore, the magnetization M of the magnetic body 20 includes a component of the X direction, which is perpendicular to both the axis direction S and the Z direction (the temperature gradient direction). This results in that an electromotive force is generated in the axis direction S.

Figure 9:
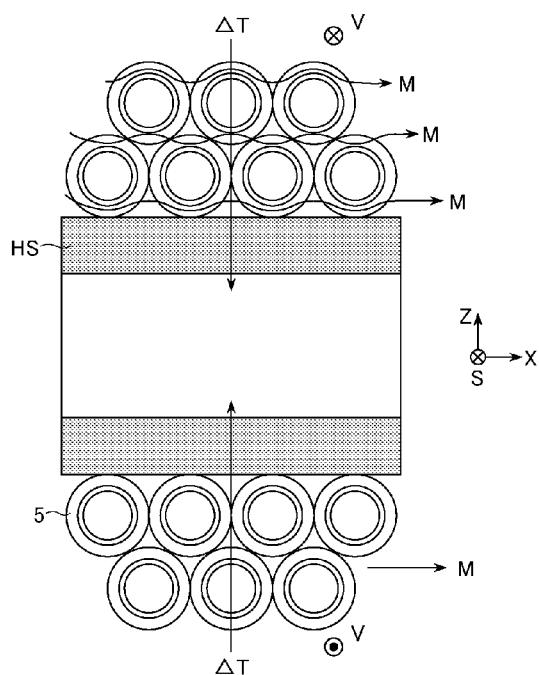
FIG. 9 schematically illustrates another example of the thermoelectric conversion system according to the second exemplary embodiment of the present invention.

FIG. 9 illustrates an installation form in which the cable 5 is wound around a cylindrical heat source HS (for example, a heat exhaustion tube), similarly to the above-described case illustrated in FIG. 6. The extending direction of the cylindrical heat source HS is the X direction, and the radial direction thereof is the Z direction, which is perpendicular to the X direction. The cable 5 is "helically" wound around the cylindrical heat source HS, and the axis direction S of the cable 5 includes a component perpendicular to the X direction and Z direction.

As illustrated in FIG. 9, the magnetization M of the magnetic body included in the cable 5 includes a component of the X direction. Such magnetization M can be achieved, for example, by magnetizing the entire structure in the X direction after the cable 5 is wound around the heat source HS. Since the magnetization M includes the component of the X direction, an electromotive force is generated in the axis direction S, similarly to the case illustrated in FIG. 8.

It should be noted here that parts of the cable 5 adjacent to each other are magnetically coupled in the installation form illustrated in FIG. 9. Such magnetic coupling between the adjacent parts contributes stabilization of the magnetization M. Specifically, the magnetization M of the X direction can be stably maintained due to the magnetic coupling of the magnetizations M of the X direction between the adjacent parts. The stabilization of the magnetization M preferably improves the thermoelectric conversion property. The installation form illustrated in FIG. 9 is also preferable in view of the stability of the magnetization M, as well as the easy control of the output through an adjustment of the number of the turns.

Figure 10:
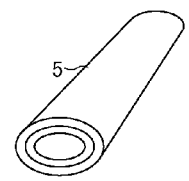
FIG. 10 illustrates an exemplary modification of the cross section structure of the cable of the thermoelectric conversion element according to the second exemplary embodiment of the present invention.
Figure 11:
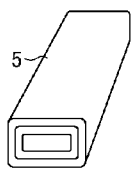
FIG. 11 illustrates another exemplary modification of the cross section structure of the cable of the thermoelectric conversion element according to the second exemplary embodiment of the present invention.
Figure 12:
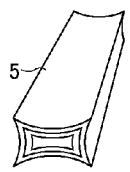
FIG. 12 illustrates still another exemplary modification of the cross section structure of the cable of the thermoelectric conversion element according to the second exemplary embodiment of the present invention.

In view of the stability of the magnetization M, various modifications may be allowed with respect to the cross section shape of the cable 5. When the cable 5 has an anisotropic cross section shape for which a short axis and a long axis can be defined, the magnetization M is easy to be stabilized in the long axis due to the shape induced magnetic anisotropy. For example, the cross section shape of the cable 5 may be oval as illustrated in FIG. 10 or rectangular as illustrated in FIG. 11. Furthermore, the cross section shape of the cable 5 may be designed, for example, as illustrated in FIG. 12.

3. Third Exemplary Embodiment

Figure 13:
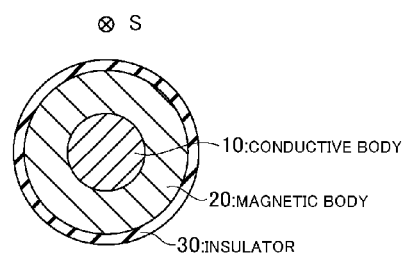
FIG. 13 schematically illustrates one example of the cross section structure of a cable of a thermoelectric conversion element according to the third exemplary embodiment of the present invention.
Figure 14:
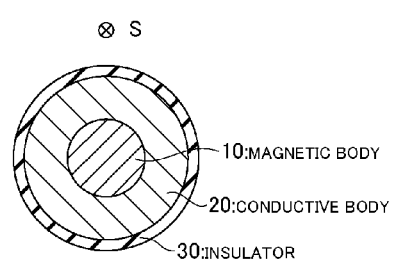
FIG. 14 schematically illustrates another example of the cross section structure of the cable of the thermoelectric conversion element according to the third exemplary embodiment of the present invention.

Various layered structures may be used for the cable 5 of the thermoelectric conversion element 1. In the example illustrated in FIG. 13, the first member 10, which is the inner layer, is conductive, while the second member 20, which is the outer layer, is magnetic. In the example illustrated in FIG. 14, in contrast, the first member 10, which is the inner layer, is magnetic, while the second member 20, which is the outer layer, is conductive. For both the layered structures, the cable 5 functions as the "thermoelectric conversion section".

Figure 15:
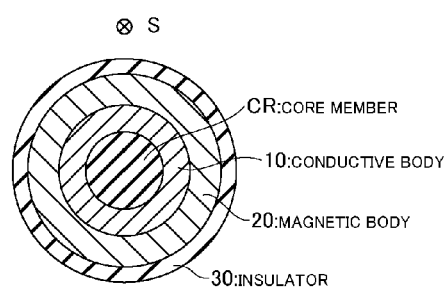
FIG. 15 schematically illustrates still another example of the cross section structure of the cable of the thermoelectric conversion element according to the third exemplary embodiment of the present invention.
Figure 16:
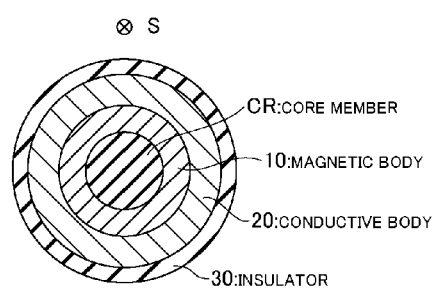
FIG. 16 schematically illustrates still another example of the cross section structure of the cable of the thermoelectric conversion element according to the third exemplary embodiment of the present invention.

As illustrated in FIGS. 15 and 16, a core member CR, which is extended in the axis direction S, may be formed inside the first member 10. In this case, the core member CR is the innermost layer of the cable 5, and the first member 10 is formed to cover at least a part of the outer face of the core member CR. The core member CR is formed of material having heat stability and flexibility (such as metal, carbon fiber and glass fiber). In the example illustrated in FIG. 15, the first member 10, which is the inner layer, is conductive, while the second member 20, which is the outer layer, is magnetic. In the example illustrated in FIG. 16, in contrast, the first member 10, which is the inner layer, is magnetic, while the second member 20, which is the outer layer, is conductive. For both the layered structures, the cable 5 functions as the "thermoelectric conversion section".

Figure 17:
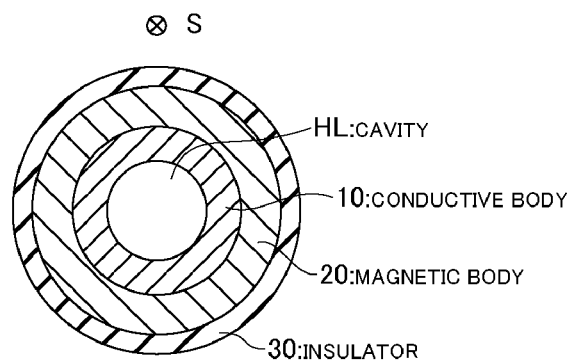
FIG. 17 schematically illustrates still another example of the cross section structure of the cable of the thermoelectric conversion element according to the third exemplary embodiment of the present invention.
Figure 18:
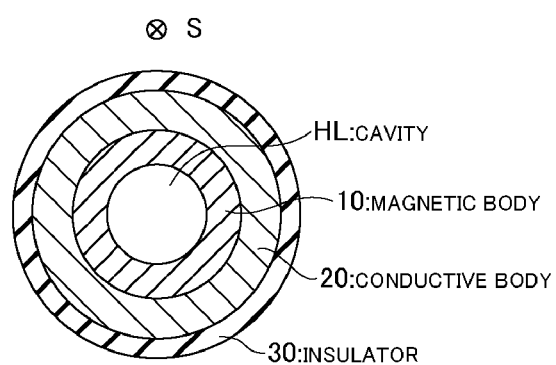
FIG. 18 schematically illustrates still another example of the cross section structure of the cable of the thermoelectric conversion element according to the third exemplary embodiment of the present invention.

Alternatively, as illustrated in FIGS. 17 and 18, a cavity HL extended in the axis direction S may be formed in the first member 10. In this case, the first member 10 is formed to be hollow. In the example illustrated in FIG. 17, the first member 10, which is the inner layer, is conductive, while the second member 20, which is the outer layer, is magnetic. In the example illustrated in FIG. 18, in contrast, the first member 10, which is the inner layer, is magnetic, while the second member 20, which is the outer layer, is conductive. For both the layered structures, the cable 5 functions as the "thermoelectric conversion section".

Furthermore, as illustrated in FIGS. 13 to 18, an insulator 30 may be formed as an outer layer around the second member 20. More specifically, the insulator 30 is extended in the axis direction S to cover the outer face of the second member 20. The insulator 30 functions as a protection film and avoids short-circuiting to an adjacent cable 5. It should be noted, however, that the insulator 30 is not a necessary member, since the thermoelectric conversion element effectively works even when adjacent cables 5 are short-circuited to each other. When short-circuiting occurs at two positions apart from each other in the axis direction S, for example, this results in that thermoelectric conversion elements are connected in parallel between the two positions.

4. Fourth Exemplary Embodiment

Figure 19:
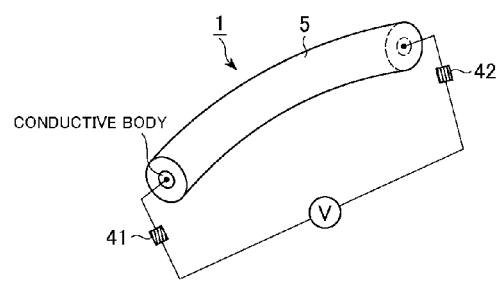
FIG. 19 schematically illustrates one example of a thermoelectric conversion element according to a fourth exemplary embodiment of the present invention.

In a typical implementation, the thermoelectric conversion element 1 includes electrodes for extracting power generated by the cable 5. As illustrated in FIG. 19, for example, the thermoelectric conversion element 1 may include a first electrode 41 and a second electrode 42, in addition to the cable 5. The first electrode 41 and the second electrode 42 are electrically connected to the conductive body of the cable 5 at different positions. In other words, the first electrode 41 is electrically connected to the conductive body at a first position, and the second electrode 42 is electrically connected to the conductive body at a second position different from the first position. The use of the pair of electrodes 41 and 42 thus-described allows extracting the electric power generated by the cable 5.

Figure 20:
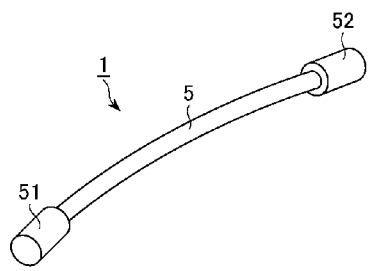
FIG. 20 schematically illustrates another example of the thermoelectric conversion element according to the fourth exemplary embodiment of the present invention.

As illustrated in FIG. 20, a first connector 51 and a second connector 52 may be disposed at both ends of the cable 5. The first connector 51 includes the first electrode 41 and the second connector 52 includes the second electrode 42. Furthermore, the first connector 51 and the second connector 52 are connectable to each other. A plurality of cables 5 may be connected in series with such-designed connectors 51 and 52. The output power is adjustable by adjusting the number of the cables 5 connected.

5. Fifth Exemplary Embodiment

Figure 21:
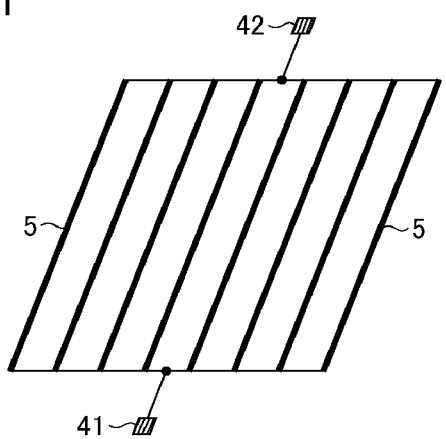
FIG. 21 schematically illustrates one example of a thermoelectric conversion element according to a fifth exemplary embodiment of the present invention.
Figure 22:
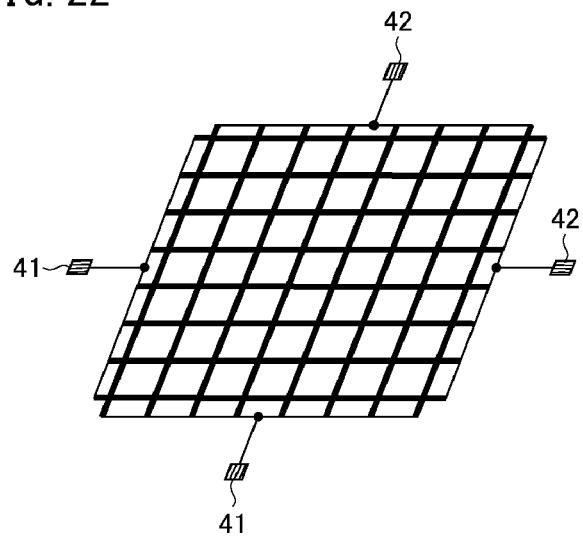
FIG. 22 schematically illustrates another example of the thermoelectric conversion element according to the fifth exemplary embodiment of the present invention.

As illustrated in FIG. 21, a sheet-shaped thermoelectric conversion element 1 may be constructed by connecting a plurality of cables 5 in parallel. In this case, a first electrode 41 is commonly connected to one end of each cable 5 and a second electrode 42 is commonly connected to the other end of each cable 5. In the example illustrated in FIG. 22, two sheet-shaped thermoelectric conversion elements 1 illustrated in FIG. 21 are stacked. The use of the sheet-shaped thermoelectric conversion elements 1 illustrated in FIGS. 21 and 22 enables obtaining a large output current. Also, in a possible implementation, a sheet-shaped thermoelectric conversion element 1 thus structured may be wounded around a heat source HS.

It should be noted that the above-described exemplary embodiments may be arbitrarily combined, as long as no contradiction occurs.

6. Sixth Exemplary Embodiment

A manufacturing method of the above-described thermoelectric conversion element 1 is as follows:

A cable 5 is first formed. The step of forming the cable 5 includes: a step of forming a first member 10 extended in the axis direction S of the cable 5, and a step of forming a second member 20 extended in the axis direction S to cover at least a part of the outer face 11 of the first member 10. Here, one of the first member 10 and the second member 20 is magnetic and the other of the first member 10 and the second member 20 is conductive.

A core member CR (see FIGS. 15 and 16) and an insulator 30 (see FIGS. 13 to 18) may be formed as necessary.

When the innermost member of the cable 5 is to be formed of glass or magnetic ceramic, a "drawing furnace", which is a generally-used optical fiber manufacturing method (see JP 2010-13328 A1), may be used. When the innermost member of the cable 5 is to be formed of metal, a generally-used manufacturing method for thin metal wires may be used (see JP S63-256218 A).

When a ceramic layer is formed as an outer layer around the innermost member, a sintering method based on an MOD (metal organic decomposition) method, a spraying method based on an AD (aerosol decomposition) method and a ferrite plating method may be used.

When a metal layer is formed as an outer layer around the innermost member, a generally-used vacuum deposition method (such as sputtering), coating and sintering of nano-colloid solution (see JP H07-188934 A and H09-20980 A) or the like may be used.

In all the cases described above, what is only required is to sequentially form necessary layers; no conventional patterning of electrodes is required. This feature is suitable for mass production. The mass production enables greatly reducing the production cost.

It is preferable that the magnetization M of the magnetic body included in the cable 5 is directed as illustrated in the aforementioned FIGS. 7 to 9. That is, it is preferable that the magnetization M of the magnetic body is directed to include a component of a direction perpendicular to the axis direction S. Such magnetization M may be achieved, for example, by magnetizing the whole structure after arranging the cable 5 to be thermally coupled to a heat source HS.

Exemplary embodiments of the present invention have been described above with reference to the attached drawings. It should be noted, however, that the present invention is not limited to the above-described exemplary embodiments; embodiments may be modified by a person skilled in the art without departing from the substance.

Some or all of the above-described exemplary embodiments may be represented as the following supplementary notes, but not limited to the same.

(Supplementary Note 1)

A thermoelectric conversion element, including:
a cable including:
a first member extended in an axis direction of said cable; and
a second member extended in said axis direction to cover at least a part of an outer face of said first member,
wherein one of said first member and said second member includes a magnetic body, and
wherein the other of said first member and said second member includes a conductive body formed of material exhibiting a spin orbit coupling.

(Supplementary Note 2)

The thermoelectric conversion element according to supplementary note 1, wherein a magnetization of said magnetic body includes a component of a direction perpendicular to said axis direction.

(Supplementary Note 3)

The thermoelectric conversion element according to supplementary note 2, wherein said cable is thermally coupled to a heat source and said magnetization of said magnetic body includes a component of a direction perpendicular to both of said axis direction and a first direction, said first direction being defined as a direction from said heat source to said cable.

(Supplementary Note 4)

The thermoelectric conversion element according to any one of supplementary notes 1 to 3, further including:
a first electrode electrically connected to said conductive body at a first position; and
a second electrode electrically connected to said conductive body at a second position different from said first position.

(Supplementary Note 5)

The thermoelectric conversion element according to any one of supplementary notes 1 to 4, wherein said cable further includes:
an insulator extended in said axis direction to cover an outer face of said second member.

(Supplementary Note 6)

The thermoelectric conversion element according to any one of supplementary notes 1 to 5, wherein said cable further includes:
a core member extended in said axis direction inside said first member.

(Supplementary Note 7)

The thermoelectric conversion element according to any one of supplementary notes 1 to 5, wherein a cavity extended in said axis direction is formed in said first member.

(Supplementary Note 8)

The thermoelectric conversion element according to any one of supplementary notes 1 to 7, wherein said cable is bent and includes parts adjacent to each other.

(Supplementary Note 9)

The thermoelectric conversion element according to supplementary note 8, wherein said cable is wounded around an object.

(Supplementary Note 10)

The thermoelectric conversion element according to any one of supplementary notes 1 to 9, wherein the thermoelectric conversion element includes a plurality of said cables, and wherein said cables are connected in parallel to each other.

(Supplementary Note 11)

A thermoelectric conversion system, including: a thermoelectric conversion element according to any one of supplementary notes 1 to 10, and a heat source arranged to be thermally coupled with said cable of said thermoelectric conversion element.

(Supplementary Note 12)

The thermoelectric conversion system according to supplementary note 11, wherein said cable of said thermoelectric conversion element is wounded around said heat source.

(Supplementary Note 13)

The thermoelectric conversion system according to supplementary note 12, wherein said cable of said thermoelectric conversion element includes parts adjacent to each other.

(Supplementary Note 14)

A manufacturing method of a thermoelectric conversion element, the method including:
forming a cable;
wherein the forming said cable includes:
forming a first member extended in an axis direction of said cable; and forming a second member extended in said axis direction to cover at least a part of an outer face of said first member, wherein one of said first member and said second member includes a magnetic body, and wherein the other of said first member and said second member includes a conductive body formed of material exhibiting a spin orbit coupling.

(Supplementary Note 15)

The manufacturing method according to supplementary note 14, further including:

directing a magnetization of said magnetic body so that to the magnetization include a component of a direction perpendicular to said axis direction.

(Supplementary Note 16)

The manufacturing method according to supplementary note 15, further including:

arranging said cable to be thermally coupled with a heat source, wherein, in the directing said magnetization of said magnetic body, said magnetization of said magnetic body is directed to include a component of a direction perpendicular to both of said axis direction and a first direction which is defined as a direction from said heat source to said cable.

The present application claims priority based on Japanese Patent Application No. 2012-085925, filed on Apr. 4, 2012, the disclosure of which is incorporated herein in its entirety by reference.

The invention claimed is:

1. A thermoelectric conversion element, comprising:
a flexible cable including:
   a first member extended continuously in an axis direction of said flexible cable, and
   a second member extended continuously in said axis direction to cover an outside surface of the first member coaxially perpendicular to an axial direction of the first member,
wherein one of said first member and said second member includes a magnetic body,
wherein the other of said first member and said second member includes a conductive body formed of material exhibiting a spin orbit coupling,
the first member and the second member are configured such that a spin current is transferred between the first member and the second member when a temperature gradient perpendicular to the axial direction is applied, and
magnetization of said magnetic body is perpendicular to the axial direction and the temperature gradient.

2. The thermoelectric conversion element according to claim 1, wherein the magnetization of said magnetic body includes a component of a direction perpendicular to said axis direction.

3. The thermoelectric conversion element according to claim 2, wherein said flexible cable is thermally coupled to a heat source and said magnetization of said magnetic body includes a component of a direction perpendicular to both of said axis direction and a first direction, said first direction being defined as a direction from said heat source to said flexible cable.

4. The thermoelectric conversion element according to claim 1, further comprising:
a first electrode electrically connected to said conductive body at a first position which is one end of said flexible cable;

a second electrode electrically connected to said conductive body at a second position which is the other end of said flexible cable, and said flexible cable has a length to obtain an electromotive force desired to be generated.

5. The thermoelectric conversion element according to claim 1, wherein said flexible cable further includes:
an insulator extended in said axis direction to cover an outer face in a radial direction of said second member.

6. The thermoelectric conversion element according to claim 1, wherein said flexible cable further includes:
a core member extended in said axis direction inside said first member.

7. The thermoelectric conversion element according to claim 1, wherein a cavity extended in said axis direction is formed inside said first member.

8. The thermoelectric conversion element according to claim 1, wherein said flexible cable is bent and includes parts adjacent to each other.

9. The thermoelectric conversion element according to claim 8, wherein said flexible cable is wound around an object.

10. The thermoelectric conversion element according to claim 1, wherein the thermoelectric conversion element includes a plurality of said flexible cables, and
wherein said flexible cables are connected in parallel to each other.

11. A thermoelectric conversion system, comprising:
a thermoelectric conversion element; and
a heat source configured to be thermally coupled with a flexible cable of said thermoelectric conversion element,
wherein said thermoelectric conversion element comprises:
   a first member extended continuously in an axis direction of said flexible cable, and
   a second member extended continuously in said axis direction to cover an outside surface of the first member coaxially perpendicular to an axial direction of the first member,
wherein one of said first member and said second member includes a magnetic body,
wherein the other of said first member and said second member includes a conductive body formed of material exhibiting a spin orbit coupling,
the first member and the second member are configured such that a spin current is transferred between the first member and the second member when a temperature gradient perpendicular to the axial direction is applied,
magnetization of said magnetic body is perpendicular to the axial direction and the temperature gradient.

12. The thermoelectric conversion system according to claim 11, wherein said flexible cable of said thermoelectric conversion element is wound around said heat source.

13. The thermoelectric conversion system according to claim 12, wherein said flexible cable of said thermoelectric conversion element includes parts adjacent to each other.

14. A manufacturing method of a thermoelectric conversion element, the method comprising:
forming a flexible cable by forming a first member extended continuously in an axis direction of said flexible cable; and
forming a second member extended continuously in said axis direction to cover an outside surface of the first member coaxially perpendicular to an axial direction of the first member, wherein one of said first member and said second member includes a magnetic body, wherein the other of said first member and said second member includes a conductive body formed of material exhibiting a spin orbit coupling, a spin current is transferred between the first member and the second member when a temperature gradient perpendicular to the axial direction is applied, magnetization of said magnetic body is perpendicular to the axial direction and the temperature gradient.

15. The manufacturing method according to claim 14, further comprising:

directing the magnetization of said magnetic body so that the magnetization includes a component of a direction perpendicular to said axis direction.

16. The manufacturing method according to claim 15, further including:

arranging said flexible cable to be thermally coupled with a heat source, wherein, in the directing said magnetization of said magnetic body, said magnetization of said magnetic body is directed to include a component of a direction perpendicular to both of said axis direction and a first direction which is defined as a direction from said heat source to said flexible cable.

17. The thermoelectric conversion element according to claim 2, further comprising:

a first electrode electrically connected to said conductive body at a first position which is one end of said flexible cable; and a second electrode electrically connected to said conductive body at a second position which is the other end of said flexible cable.

18. The thermoelectric conversion element according to claim 3, further comprising:

a first electrode electrically connected to said conductive body at a first position which is one end of said flexible cable; and a second electrode electrically connected to said conductive body at a second position which is the other end of said flexible cable.

19. The thermoelectric conversion element according to claim 2, wherein said flexible cable further includes:

an insulator extended in said axis direction to cover an outer face of said second member.

20. The thermoelectric conversion element according to claim 3, wherein said flexible cable further includes:

an insulator extended in said axis direction to cover an outer face of said second member.

21. The thermoelectric conversion element according to claim 1, wherein said first member and said second member are in direct contact.

22. The thermoelectric conversion element according to claim 1, wherein a thin film is formed between said first member and said second member.

23. The thermoelectric conversion element according to claim 1, wherein a spin current is exchanged between said first member and said second member.

24. The thermoelectric conversion element according to claim 1, wherein an electromotive force is generated in said conductive body bringing the heat source into contact with said second member.

25. The thermoelectric conversion element according to claim 1, wherein applying a temperature gradient in a second direction perpendicular to the axis direction of said flexible cable to generate an electromotive force in said conductive body.

* * * * *